United States Patent
Sadana et al.

(10) Patent No.: US 6,259,137 B1
(45) Date of Patent: Jul. 10, 2001

(54) DEFECT INDUCED BURIED OXIDE (DIBOX) FOR THROUGHPUT SOI

(75) Inventors: Devendra Kumar Sadana, Pleasantville, NY (US); Joel P. de Souza, Porto Alegre (BR)

(73) Assignee: International Business Machines Corp., Armonk, NY (US)

(*) Notice: Subject to any disclaimer, the term of this patent is extended or adjusted under 35 U.S.C. 154(b) by 0 days.

(21) Appl. No.: 09/264,973

(22) Filed: Mar. 9, 1999

Related U.S. Application Data

(62) Division of application No. 08/995,585, filed on Dec. 22, 1997, now Pat. No. 5,930,643.

(51) Int. Cl.$^7$ .................................................. H01L 29/00
(52) U.S. Cl. ..................... 257/347; 257/348; 257/349; 257/350; 257/351; 257/352; 257/353; 257/354; 257/355
(58) Field of Search .................................... 257/347–355

(56) References Cited

U.S. PATENT DOCUMENTS

| | | |
|---|---|---|
| 4,749,660 | 6/1988 | Short et al. . |
| 4,786,608 | 11/1988 | Griffith . |
| 4,902,642 | 2/1990 | Mao et al. . |
| 4,975,126 | 12/1990 | Margail et al. . |
| 5,279,978 | 1/1994 | See et al. . |
| 5,288,650 | 2/1994 | Sandow . |
| 5,519,336 | 5/1996 | Liu et al. . |
| 5,589,407 | 12/1996 | Meyappan et al. . |
| 6,043,166 | 3/2000 | Roitman et al. . |

FOREIGN PATENT DOCUMENTS 63-217657   9/1988   (JP) .

OTHER PUBLICATIONS

White A. E., et al.: "The role of implant temperature in the formation of thin buried oxide layers" Beam©Solid Interactions and Transient Processes Symposium, Boston, MA, USA, Dec. 1–4, 1986, pp. 585©590, XP000922701.

Stanley Wolf, "Silicon Processing for the VLSI Era", vol. 2: Process Integration, 1990, pp. 72–73.

*Primary Examiner*—Fetsum Abraham
(74) *Attorney, Agent, or Firm*—Scully, Scott, Murphy & Presser; Robert M. Trepp, Esq.

(57) ABSTRACT

A method of fabricating a defect induced buried oxide (DIBOX) region in a semiconductor substrate utilizing a first low energy implantation step to create a stable defect region; a second low energy implantation step to create an amorphous layer adjacent to the stable defect region; oxidation and, optionally, annealing, is provided. Silicon-on-insulator (SOI) materials comprising said semiconductor substrate having said DIBOX is also provided herein.

20 Claims, 2 Drawing Sheets

DEFECT INDUCED BURIED OXIDE (DIBOX) FOR THROUGHPUT SOI

Related Application

This application is a divisional application of U.S. Ser. No. 08/995,585, filed Dec. 22, 1997 now U.S. Pat. No. 5,930,643.

FIELD OF THE INVENTION

The present invention relates to producing high throughput silicon on insulator (SOI) materials and, in particular, to a method of fabricating a defect induced buried oxide (DIBOX) region in a semiconductor substrate. The DIBOX region produced by the method of the present invention has improved structural and electrical qualities as compared with prior art BOX regions. Moreover, the method of the present invention produces BOX regions having a greater thickness than prior art methods. Hence, the method of the present invention saves implant time and ultimately SOI wafer cost.

BACKGROUND OF THE INVENTION

In semiconductor manufacturing, several processes have been developed to produce a SOI device having a thin buried oxide (BOX) region disposed therein. One such process used in the prior art to produce BOX regions is referred to as SIMOX (separation by implantation of oxygen). In this process, the BOX region is fabricated by first implanting oxygen using high ion doses ($>4 \times 10^{17}$ cm$^{-2}$) followed by annealing at high temperatures ($>1300°$ C.) Despite the current advances made in this field most of the prior art SIMOX processes produce a BOX region which is electrically inferior to thermally created oxide regions. Moreover, prior art SIMOX processes often times create a BOX region which contains silicon islands buried within the BOX. Typically, BOX regions produced using prior art SIMOX processes have discrete regions of thicknesses of about 1000 Å or 2000 Å. These thicknesses are determined by the implanted oxygen dose which is in the range of about 4–5×10$^{17}$ cm$^{-2}$ for the 1000 Å thick BOX and about 8–10×10$^{17}$ cm$^{-2}$ for the 2000 Å thick BOX. Thinner continuous BOX regions cannot be obtained using prior art SIMOX processes. Moreover, the prior art use of high ion doses to create a BOX region in a semiconductor substrate is not economical and is usually four to six times the bulk-silicon cost. This high cost makes the use of prior art SOI materials undesirable.

In view of the drawbacks mentioned hereinabove concerning prior SIMOX processes of fabricating a BOX region in a semiconductor material, there remains a need for providing a new and improved method of creating a BOX region in SOI materials. Specifically, it would be desirable to provide a new method wherein a continuous BOX region could be created in a semiconductor substrate having a wide range of thicknesses.

SUMMARY

One object of the present invention is to provide a method of fabricating a semiconductor material containing a defect induced buried oxide (BOX) region therein.

Another object of the present invention is to provide a method whereby all of the aforementioned problems with prior art SIMOX processes have been overcome.

A further object of the present invention is to provide a method which allows for the fabrication of a continuous BOX region using oxygen doses of about 3×10$^{17}$ cm$^{-2}$ or less.

A still further object of the present invention is to provide a method which allows for the fabrication of a BOX region that exhibits high structural as well as electrical qualities.

A yet further object of the present invention is to provide a BOX region in a SOI material which has a greater range of thickness than BOX regions prepared using conventional methods.

These as well as other objects and advantages are achieved by the method of the present invention wherein a defect induced buried oxide region is formed in a semiconductor material using lower ion doses than heretofore reported in the prior art.

Specifically, the method of the present invention comprises the steps of:

(a) creating a stable buried damaged region in a semiconductor substrate;

(b) forming an amorphous layer adjacent to said stable buried damaged region;

(c) oxidizing the structure produced by step (b); and (d) optionally, annealing the oxidized structure provided in step (c).

According to a preferred embodiment of the present invention, step (a) is carried out by implanting oxygen ions into a semiconductor substrate, which is either bare or contains a cap layer, e.g., a dielectric cap layer, using a low dose ion implantation step (on the order of 5×10$^{16}$ cm$^{-2}$ or greater) which is carried out at a high temperature of from about 200° C. or higher.

Step (b) of the present invention includes a yet lower ion dose implantation step using the same or different energy and ion as used in step (a). Step (b) of the present invention is carried out at about cryogenic temperatures to temperatures of about 300° C. or less. The ion dosage used in this step of the present invention is generally of from about 2×10$^{14}$ to about 4×10$^{15}$ cm$^{-2}$.

This low temperature/low dose ion implantation step may be carried out in either a single step with a single temperature or multiple steps with multiple temperatures which range from about cryogenic to about 300° C. or less.

The oxidation step, step (c), is typically carried out in an inert ambient such as N$_2$ or Ar mixed with oxygen at temperatures of from about 1300° C. or higher. Under some circumstances, particularly when like ions are implanted in steps (a) and (b), this step causes the formation of a continuous BOX region.

The optional step of the present invention is an anneal step which is normally carried out in an ambient containing a mixture of an inert gas and oxygen at temperatures of about 1300° C. or higher for a period of time of about 5 to about 20 hours. The optional anneal step is carried when the foregoing oxidation step does not form a BOX region with desired structural and electrical properties. Normally, a BOX region is formed after oxidation when like ions, such as oxygen ions, are implanted in both steps (a) and (b).

The term "high structural quality" is used herein to denote a structure which has little or no etch pit density (less than 1×10$^5$ cm$^{-2}$); little or no top or bottom Si/buried oxide roughness (less than 200 Å as observed by TEM spectroscopy); a low HF-defect density (less than 5 cm$^{-2}$); a low surface roughness (5 Å root mean square(Rms)); and, if present, the silicon precipitates in the buried oxide region at a low density (less than 1×10$^5$ cm$^{-2}$) and a small size (less than 500 Å in height). The structural quality can be determined using optical, atomic force scanning and/or transmission microscopy.

The term "high electrical quality" is used herein to denote a structure wherein the BOX breakdown field is high (greater than 5 megavolts per cm); the BOX minibreakdown voltage is high (greater than 30 volts); the BOX leakage at a given voltage is low (less than 1 nanoAmps); and the BOX defect density is low (less than 2 cm$^{-2}$)

Another aspect of the present invention relates to a SOI material having a continuous BOX region formed in a semiconductor substrate by the method of the present invention. The BOX region formed by the instant invention has a variable, but controllable, continuous thickness which can typically range from about 800 to about 2000 Å by varying the first ion implantation step such that the base dose is from about $2 \times 10^{17}$ to about $6 \times 10^{17}$ cm$^{-2}$. Such a controllable, continuous range of BOX thicknesses cannot be obtained utilizing prior art SIMOX processes.

DETAILED DESCRIPTION OF THE INVENTION

Figure 1A:
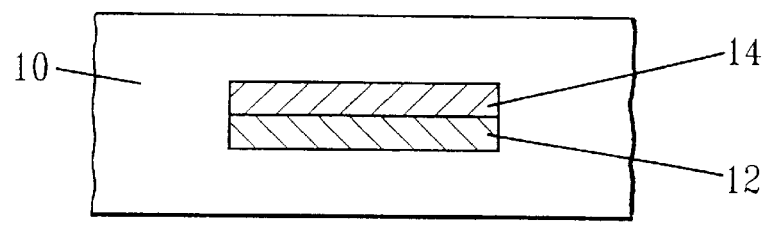
FIGS. 1(a)–(d) are cross-sectional views of a semiconductor substrate after different processing steps of the present invention.

The present invention which provides a method of fabricating a DIBOX in a semiconductor substrate will now be described in more detail with reference to the accompanying drawings wherein like reference numerals are used for like and corresponding elements of the drawings.

Referring first to FIG. 1(a), there is shown a semiconductor substrate 10 containing a stable buried damaged region 12 and an amorphous region 14 which are formed in the surface of the semiconductor substrate using steps (a) and (b) of the present invention. These two steps as well as other aspects and embodiments of the present invention will now be described. It should be emphasized that the blanket structure shown in FIG. 1(a) can be employed as well as patterned SOI structures which may contain various mask materials such as dielectric cap layers and the like on the surface of the semiconductor substrate to define SOI regions. For clarity, the mask materials or dielectric cap layers that may be present on the surface of semiconductor substrate 10 are not shown in the drawings.

Semiconductor substrate 10 that is employed in the present invention is composed of conventional semiconductor materials which are typically employed in forming SOI devices. Examples of such semiconductor materials include, but are not limited to, silicon (Si), germanium (Ge), Si/Ge alloys, gallium arsenide (GaAs), and other 4-4, 3-5, 2-6 binary or ternary compounds. A highly preferred semiconductor material for semiconductor substrate 10 is Si.

The semiconductor substrate can be used as is, or it may be cleaned prior to use to remove any contaminants which may be present in or on the substrate. Any of the well known cleaning methods known to those skilled in the art may be employed in the present invention to remove said contaminants.

Next, semiconductor substrate 10 is irradiated with a first ion at a first dose; i.e. base dose, sufficient to implant said first ion into semiconductor substrate 10. In accordance with this step of the present invention, an ion is implanted into semiconductor substrate 10 by utilizing a SIMOX or other equivalent implanter. The ions that are implanted by this step are those which are capable of creating a stable defect region 12 in semiconductor substrate 10. Examples of such ions that can be employed in the present invention are oxygen, nitrogen, carbon, germanium, bismuth, antimony, phosphorus, arsenic and the like. A highly preferred first ion employed in the present invention is oxygen.

As stated above, the first ion is implanted utilizing a high temperature/low dose SIMOX ion implantation step. Accordingly, the first ion is implanted utilizing an ion implantation apparatus having a beam current of from about 5 to about 60 milliamps and that operates at an energy of from about 30 to about 400 keV. More preferably, the first ion is implanted at an energy of from about 170 to about 200 keV. The dosage, i.e. concentration, of the first ion implanted is from about $5 \times 10^{16}$ to about $6 \times 10^{17}$ cm$^{-2}$. More preferably, the dosage of the first ion is from about $2 \times 10^{17}$ to about $5 \times 10^{17}$ cm$^{-2}$.

This first ion implantation step, or base ion implantation step, is carried out at a temperature of from about 200° to about 700° C. for a time period of from about 100 to about 200 minutes. More preferably, step (a) of the present invention is carried out at a temperature of from about 550° to about 575° C. for a time period of from about 150 to about 180 minutes.

Using the above defined parameters, the first ion used in forming damaged region 12 is implanted to a depth of from about 1000 to about 4000 Å. More preferably, the first ion used in forming damaged region 12 is implanted to a depth of from about 3000 to about 4000 Å.

Adjacent amorphous region 14, which is connected to damaged region 12, is created by irradiating the surface of semiconductor substrate 10 containing damaged region 12 using a low temperature/low dose ion implantation step. The second implanted ion used in creating amorphous region 14 in semiconductor substrate 10 can be the same or different from the first ion used in creating damaged region 12. A highly preferred second ion used in forming amorphous region 14 is oxygen. It should be noted that although FIG. 1(a) depicts the adjacent amorphous region as being shallower than the damaged region, the present invention also contemplates that amorphous region 14 can be at the same or deeper depth than the damaged region.

The implant energy used in forming amorphous region 14 is from about 50 to about 200 kev. More preferably, amorphous region 14 is formed by implanting said second ion using an energy of from about 170 to about 200 keV. The dose of the second ion used in forming amorphous region 14 is from about $1 \times 10^{14}$ to about $1 \times 10^{16}$, more preferably, from about $3 \times 10^{14}$ to about $2 \times 10^{15}$, cm$^{-2}$.

Unlike the first step of the present invention, which is conducted at high temperatures, step (b) of the present invention is conducted at much lower temperatures (less than 300° C.). Specifically, amorphous region 14 is formed by implanting a second ion at temperatures of from about −269° to about 300° C. for a time period of from about 5 seconds to about 20 minutes. More preferably, the low temperature/low dose ion implantation step is carried out at a temperature of from about 25° to about 150° C. for a time period of from about 30 seconds to about 5 minutes.

Using the above defined conditions, the second ion used in forming amorphous region 14 is implanted to a depth of from about 1000 to about 4000 Å. More preferably, the second ion used in forming amorphous region 14 is implanted to a depth of from about 3000 to about 4000 Å.

Figure 1B:
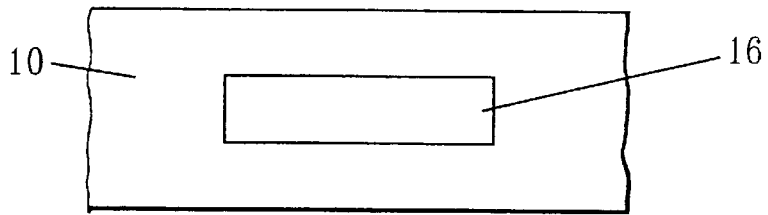

After creating damaged region 12 and amorphous region 14 in semiconductor substrate 10, the semiconductor material is then subjected to oxidation under conditions effective to cause diffusion of oxygen into semiconductor substrate 10. Under appropriate conditions, a continuous BOX region 16 is formed, as is shown in FIG. 1(b).

Figure 1C:
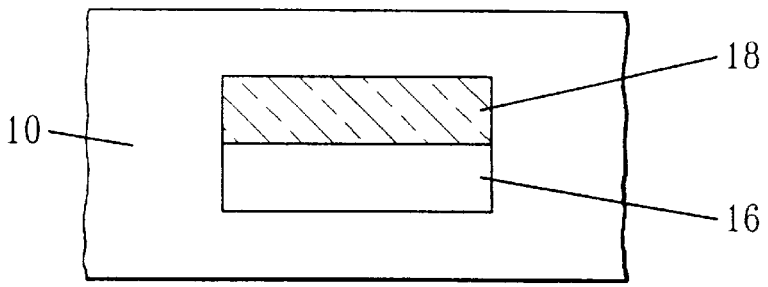

An intermediate structure which comprises a thin layer of highly defective silicon 18 adjacent to and connected to BOX region 16 can also be created by modifying oxidation conditions, as shown in FIG. 1(c). Such structures are highly desirable in SOI based integrated circuits where floating body effects need to be minimized. Further steps, i.e., annealing, are typically required when this intermediate structure forms or when the dose of the base ion implant is less than $4 \times 10^{17}$ cm$^{-2}$.

In accordance with the present invention, oxidation is carried out in an inert ambient that is mixed with oxygen. Typically, the inert ambient comprises an atmosphere of nitrogen, argon, helium or mixtures thereof that is mixed with about 5 to about 100% oxygen. A highly preferred ambient utilized in the present invention during the oxidation step is argon (Ar) that is mixed with about 10 to about 40% oxygen.

The oxidation step is carried out at temperatures of from about 1300° to about 1375° C. for a time period of from about 1 to about 24 hours. More preferably, the oxidation step of the present invention is carried out at a temperature of from about 1320° to about 1350° C. for a time period of from about 5 to about 12 hours. Following the oxidation step, the surface oxide that is formed may or may not be removed with HF prior to annealing.

Figure 1D:
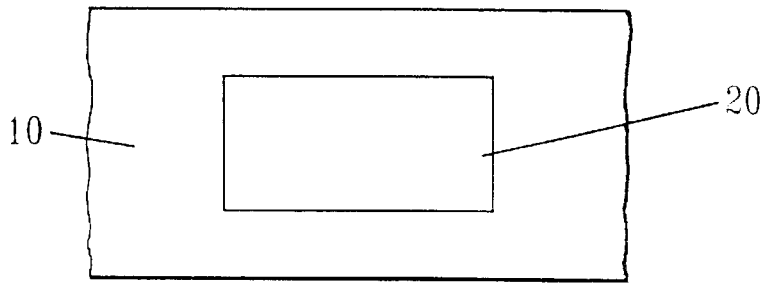

When the intermediate structure shown in FIG. 1(c) is formed it is then annealed in an inert gas atmosphere, e.g. nitrogen, argon and the like, under conditions which are effective in improving the previously-formed buried oxide regions. The annealing step may also be carried out in an inert gas atmosphere that is mixed with from about 0.2 to about 5% oxygen. FIG. 1(d) shows the after annealed product containing a new buried oxide region 20. Buried oxide region 20 is formed by annealing at a temperature of from about 1250° to about 1350° C. for a time period of from about 1 to about 24 hours. More preferably, annealing is conducted at a temperature of from about 1320° to about 1350° C. for a time period of from about 5 to about 15 hours.

In addition to separate oxidation and annealing steps, the present invention also contemplates combining these two processes into one heat cycle. When this embodiment of the present invention is carried out, the structure containing damage region 12 and amorphous region 14 is subjected to the following conditions: First, the structure is initially heated from room temperature to a temperature of from about 1300° to about 1375° C. using a ramp-up rate of from about 2 to about 10° C./min. This initial heating is typically carried out in an inert gas atmosphere which can be mixed with oxygen. When oxygen is present in the initial heating step, it typically is present in an amount of from 0.1 to about 10%. Various hold or so-called 'soak cycles' may be included in the initial heating step. When such a soak cycle is required, it typically occurs at about 1000° C. for a time period of from about 5 to about 120 minutes. After said soak cycle, the structure is heated from 1000° C. to the desired oxidation temperature (from about 1300° to about 1375° C.) at a ramp-up rate of from about 1° to about 5° C./min.

Thereafter, oxidation and annealing as described hereinabove are carried out followed by subsequent cooling to room temperature in an inert gas atmosphere which may contain 0.1 to 5% oxygen at a cool-down rate of from about 0.1° to about 5° C./min. Various hold or soak cycles may be employed in the cool-down portion of the heating cycle. Also, it is contemplated to change the rate of cooling during the cooling cycle. For example, at a temperature of from about 900° to about 1100° C., the cooling rate may be changed to about 0.1° to about 10° C./min until a temperature reading of from about 600° to about 800° C. is obtained. Thereafter, the cooling rate may be switched to another rate within the range of from about 3° to about 10° C./min.

It is noted that during the above described annealing step, which is carried out under a high oxygen content, two adjacent stable buried regions are created. Specifically, a highly defective region consisting of primarily Si polycrystals, microtwins and stacking faults form in the amorphous region. This defect-containing layer is believed to enhance oxygen diffusion into silicon and combines with the first created damaged layer during this annealing step to form the buried oxide region in the semiconductor substrate.

The DIBOX structures formed in the present invention can be used in forming high performance SOI devices or circuits. Examples of such devices or circuits that can contain the DIBOX of the present invention include microprocessors, memory cells such as DRAMs or SRAMs, ASICs and larger and more complicated circuits. Since these devices are well known to those skilled in the art, it is not necessary to provide a detailed description on how the same is fabricated.

The BOX regions 16 or 20 formed by the method of the present invention generally have a thickness of from about 800 to about 2000 Å. More preferably, the BOX thickness produced by the instant invention is from about 1000 to about 1500 Å. It is possible to create any number of BOX regions within a semiconductor material having various thicknesses by simply repeating the steps of the present invention.

It is noted that, if the amorphous region is not formed by the second implant, the BOX region is not continuous for ion doses of $3 \times 10^{17}$ cm$^{-2}$ or less. Moreover, pronounced surface roughness (>15 Å Rms) is observed on such samples by atomic force microscopy. Such surface roughness is incompatible with modern high density integrated circuits. In contrast, by employing the implant and annealing sequence listed above, i.e. base dose implantation and room temperature implantation in conjunction with oxidation and annealing, a highly continuous BOX structure is formed without causing any depreciable surface roughness which would limit the applicability of the sample. In the case where oxygen is implanted in steps (a) and (b), a continuous BOX region is formed directly after the oxidation step.

Figure 2:
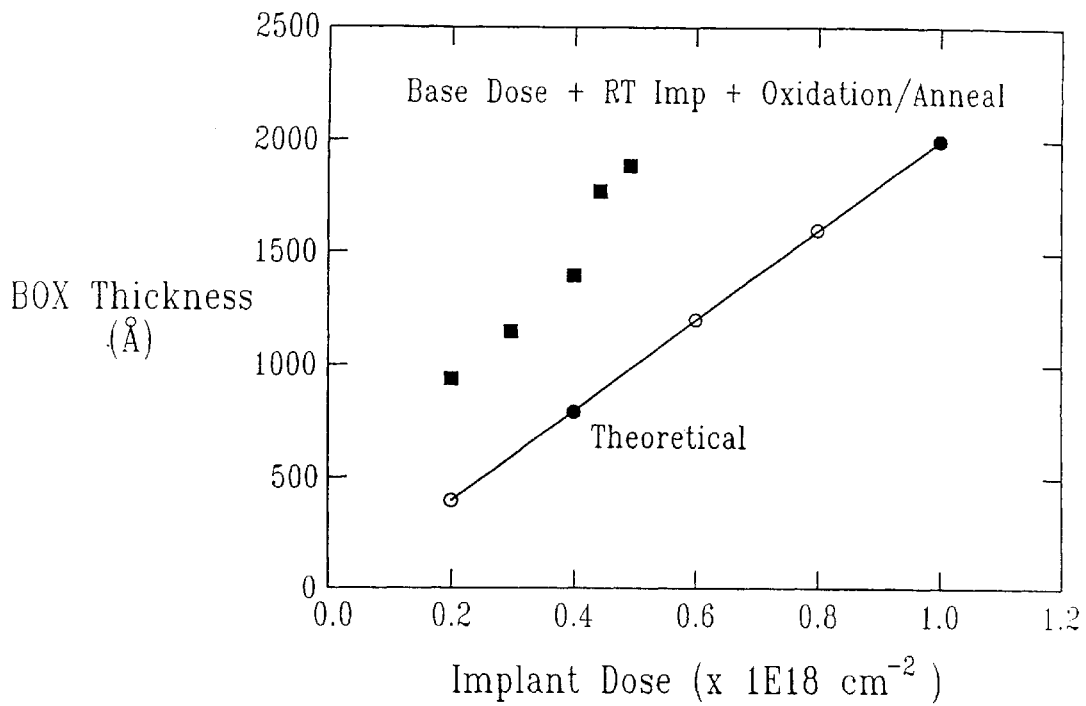
FIG. 2 is a plot showing how the damage created by room temperature implantation enhances diffusion of oxygen in silicon during high temperature annealing and creates additional oxide in the ion implanted region.

Also, as is shown in FIG. 2, the method of the present invention, i.e. room temperature implantation and high temperature annealing, enhances the diffusion of oxygen into the silicon. Specifically, in FIG. 2 the circles show how much buried oxide can be formed theoretically based on the ion dose. The squares in FIG. 2 show how much actual buried oxide is created by one embodiment of the method of the present invention. The difference of thickness at a given base dose gives the extra thermal buried oxide region created by the present invention. Thus, the method of the present invention, not only improves the electrical and structural qualities of the BOX, but also saves implant time and SOI wafer cost.

The following examples are given to illustrate the scope of the present invention. Because these examples are given for illustrative purpose only, the invention embodied thereon should not be limited thereto.

EXAMPLE 1

In this example, various DIBOX regions were created using the method of the present invention. Specifically, DIBOX regions were created in three Si wafers using the following conditions and procedures:

For Wafer 1:
- (a) base implant ion $O^+$; implant energy 185 keV; implant dose $2 \times 10^{17}$ $cm^{-2}$; implant temperature 570° C., beam current 50–55 mA;
- (b) room temperature implant ion $O^+$; implant energy 185 keV; implant temperature room temperature; beam current 10–30 mA;
- (c) oxidation: ramp-up from 200° C. to 1000° C., 4.5° C./min, ambient Ar and 2% $O_2$; Soak at 1000° C., 30 min, ambient 100% $O_2$; ramp-up from 1000° to 1320° C.: 2.6° C./min, ambient 60% Ar and 40% $O_2$; hold 12 hours;
- (d) anneal continue from (c): temperature 1320° C., hold 10 hrs, ambient Ar and 2.25% $O_2$; ramp-down to 1000° C. at 1° C./min; ramp-down from 1000° C. to 800° C. at 3° C./min; ramp-down from 800° C. to 200° C. at 4.5° C./min.

For Wafer 2:
- (a) base implant ion $O^+$; implant energy 200 keV; implant dose $3 \times 10^{17}$ $cm^{-2}$; implant temperature 570° C.; beam current 50–55 mA;
- (b) room temperature implant ion $O^+$; implant energy 200 keV; implant temperature room temperature; beam current 10–30 mA;
- (c) oxidation: ramp-up from 200° C. to 1000° C., 4.5° C./min, ambient Ar and 2% $O_2$; soak at 1000° C., 30 min, ambient 100% $O_2$; ramp-up from 1000° C. to 1320° C., 2.6° C./min, ambient 75% Ar and 25% $O_2$; hold 12 hrs;
- (d) anneal continued from (c); temperature 1320° C., hold 10 hrs, ambient Ar and 2.25% $O_2$; ramp-down to 1000° C. at 1° C./min; ramp-down from 1000° C. to 800° C. at 3° C./min; ramp-down from 800° C. to 200° C. at 4.5° C./min.

For Wafer 3
- (a) base implant ion $O^+$; implant energy 185 keV; implant dose $4.5 \times 10^{17}$ $cm^{-2}$; implant temperature 570° C.; beam current 50–55 mA;
- (b) room temperature implant ion $O^+$; implant energy 185 keV; implant temperature room temperature; beam current 10–30 mA;
- (c) oxidation: ramp-up from 200° C. to 1000° C., 4.5° C./min, ambient Ar and 2% $O_2$; soak at 1000° C., 30 min., ambient 100% $O_2$; ramp-up from 1000° C., 30 min., ambient 100%; ramp-up from 1000° C. to 1320° C., 2.6° C./min, ambient 60% Ar and 40% $O_2$; hold 12 hrs.
- (d) anneal continue from (c); temperature 1320° C., hold 10 hrs., ambient Ar and 2.25% $O_2$; ramp-down to 1000° C. at 1° C./min; ramp-down from 1000° C. to 800° C. at 3°/min; ramp-down from 800° C. to 200° C. at 4.5° C./min.

Figure 3:
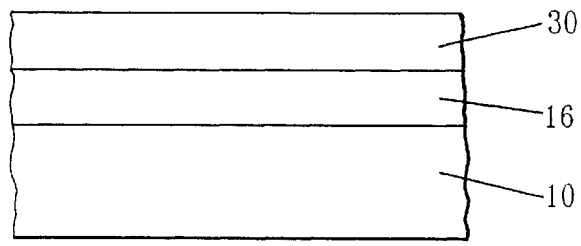
FIG. 3 is a representation of a TEM of one of the wafers treated as in Example 1.

After conducting the above steps, TEMs of each wafer were taken. A pictorial representation of one of the TEMs for one of the wafers is shown in FIG. 3. In FIG. 3, 10 represents a Si substrate, 16 represents a BOX region; and 30 represent a SOI region formed by masking Si substrate 10.

In regard to Wafer 1, a buried oxide region having a thickness of 1000Å was created by the method of the present invention. In Wafer 2, the BOX region had a thickness of 1100 Å whereas the thickness of the BOX region in Wafer 3 was 1700 Å.

The above example clearly shows that the method of the present invention is capable of producing BOX regions having various thicknesses.

While the instant invention has been particularly shown and described with respect to preferred embodiments thereof, it will be apparent to those skilled in the art that the foregoing and other changes in form and detail may be made without departing from the spirit and scope of the present invention.

Having this described our invention, what we claim is new, and desire to secure by the Letters Patent is:

1. A silicon-on-insulator material comprising a semiconductor substrate having a continuous buried oxide region formed therein, wherein said continuous buried oxide region has a variable, but controllable, continuous thickness of from about 800 to about 2000 Å and said material has an etch pit density of less than $1 \times 10^5$ $cm^{-2}$, a top or bottom Si/buried oxide roughness of less than 200 Å, HF-defect density of less than 5 Å $cm^{-2}$, and a surface roughness of less than 5 Å root mean square which is obtained by:
- (a) creating a stable buried damage region in said semiconductor substrate;
- (b) forming an amorphous layer adjacent to said stable buried damaged region; and
- (c) oxidizing the structure produced by step (b) under conditions effective to diffuse oxygen into said semiconductor substrate causing formation of said continuous buried oxide region.

2. The silicon-on-insulator material of claim 1 wherein said semiconductor substrate is Si, Ge, Si/Ge alloys, GaAs or other 4-4, 3-5, 2-6 binary or ternary compounds.

3. The silicon-on-insulator material according to claim 2 wherein said semiconductor substrate is Si.

4. The silicon-on-insulator material of claim 1 wherein said material has a buried oxide (BOX) breakdown field of greater than 5 megavolts per cm, a BOX mini-breakdown voltage of greater than 30 volts, a BOX leakage at a given voltage of less than 1 nanoAmps, and a BOX defect density of less than 2 $cm^{-2}$.

5. The silicon-on-insulator material of claim 1 wherein said continuous buried oxide region is patterned to form at least two spaced apart continuous buried oxide regions.

6. A silicon-on-insulator material comprising a semiconductor substrate having a continuous buried oxide region formed therein, wherein said continuous buried oxide region has a variable, but controllable, continuous thickness of from about 800 to about 2000 Å and said material has an etch pit density of less than $1 \times 10^5$ $cm^{-2}$, a top or bottom Si/buried oxide roughness of less than 200 Å, HF-defect density of less than 5 Å $cm^{-2}$, and a surface roughness of less than 5 Å root mean square which is obtained by:
- (a) creating a stable buried damage region in said semiconductor substrate;
- (b) forming an amorphous layer adjacent to said stable buried damaged region;
- (c) oxidizing the structure produced by step (b) under conditions effective to diffuse oxygen into said semiconductor substrate causing formation of an intermediate structure; and
- (d) annealing the intermediate structure under conditions to produce said continuous buried oxide region.

7. The silicon-on-insulator material of claim 6 wherein said continuous buried oxide region is patterned to form at least two spaced apart continuous buried oxide regions.

8. A silicon-on-insulator material comprising:
a semiconductor substrate having a continuous buried oxide (BOX) region formed therein dividing said substrate into a lower substrate below said BOX region and a highly defective region and an upper layer above said BOX region, said highly defective region positioned adjacent to said BOX region and having stacking faults and microtwins, said upper layer comprising single crystal semiconductor material positioned over said defective region and said material has an etch pit density of less than $1 \times 10^5$ cm$^{-2}$, a top or bottom Si/buried oxide roughness of less than 200 Å, HF-defect density of less than 5 Å cm$^{-2}$, and a surface roughness of less than 5 Å root mean square.

9. The silicon-on-insulator material of claim 8 further including an integrated circuit formed in said upper layer and wherein floating body effects are minimized by recombination of carriers flowing in said highly defective region.

10. The silicon-on-insulator material of claim 8 further including devices or circuits to implement functions selected from the group consisting of microprocessors, memory cells, DRAM's, SRAM's, application specific integrated circuits (ASIC's) formed in said upper layer and wherein floating body effects are minimized by recombination of carriers flowing in said highly defective region.

11. The silicon-on-insulator material of claim 10 wherein said highly defective region has a thickness selected to provide for a corresponding recombination of carriers flowing in said highly defective region.

12. The silicon-on-insulator material of claim 9 wherein said highly defective region has a thickness selected to provide for a corresponding recombination of carriers flowing in said highly defective region.

13. The silicon-on-insulator material of claim 8 wherein said highly defective region further includes Si polycrystals.

14. The silicon-on-insulator material of claim 8 wherein said continuous buried oxide region is patterned to form at least two spaced apart continuous buried oxide regions.

15. A silicon-on-insulator material comprising a semiconductor substrate having a continuous buried oxide region formed therein, wherein said continuous buried oxide region has a selected, but controllable, continuous thickness of from about 800 to about 2000 Å as a function of implanted oxygen dose, a selected variable thickness of a highly defective region adjacent to said continuous buried oxide region in the upper portion of said semiconductor substrate, said upper portion of said semiconductor substrate comprising single crystal semiconductor material, said variable thickness of said defective region determined by the room temperature ion implant dose and subsequent annealing temperature, time and ambient gaseous conditions and said material has an etch pit density of less than $1 \times 10^5$ cm$^{-2}$, a top or bottom Si/buried oxide roughness of less than 200 Å, HF-defect density of less than 5 Å cm$^{-2}$, and a surface roughness of less than 5 Å root mean square.

16. The silicon-on-insulator material of claim 15 further including an integrated circuit formed in said upper portion of said semiconductor substrate and wherein floating body effects are minimized by recombination of carriers flowing in said highly defective region.

17. The silicon-on-insulator material of claim 16 wherein said highly defective region has a thickness selected to provide for a corresponding recombination of carriers flowing in said highly defective region.

18. The silicon-on-insulator material of claim 15 further including devices or circuits to implement functions selected from the group consisting of microprocessors, memory cells, DRAM's, SRAM's, application specific integrated circuits (ASIC's) formed in said upper portion of said semiconductor substrate and wherein floating body effects are minimized by recombination of carriers flowing in said highly defective region.

19. The silicon-on-insulator material of claim 18 wherein said highly defective region has a thickness selected to provide for a corresponding recombination of carriers flowing in said highly defective region.

20. The silicon-on-insulator material of claim 15 wherein said continuous buried oxide region is patterned to form at least two spaced apart continuous buried oxide regions.

* * * * *